(12) United States Patent
Tsuchiya et al.

(10) Patent No.: US 9,921,259 B2
(45) Date of Patent: Mar. 20, 2018

(54) GROUND FAULT DETECTING DEVICE

(71) Applicant: Keihin Corporation, Tokyo (JP)

(72) Inventors: Shingo Tsuchiya, Shioya-gun (JP); Seiji Kamata, Shioya-gun (JP); Takashi Ikeda, Kawasaki-shi (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 15/361,913

(22) Filed: Nov. 28, 2016

(65) Prior Publication Data

US 2017/0234918 A1 Aug. 17, 2017

(30) Foreign Application Priority Data

Feb. 17, 2016 (JP) ................................. 2016-028086

(51) Int. Cl.
G01R 31/02 (2006.01)
G01R 31/00 (2006.01)

(52) U.S. Cl.
CPC ......... G01R 31/025 (2013.01); G01R 31/006 (2013.01)

(58) Field of Classification Search
CPC ........................... G01R 31/025; G01R 31/006; G01R 31/3658; G06F 3/044; H01L 27/0251
USPC ....... 324/425–440, 444, 255, 500, 522, 713, 324/72.5, 76.11, 134, 111, 538–543, 600, 324/756.01
See application file for complete search history.

(56) References Cited

U.S. PATENT DOCUMENTS

2014/0008970 A1* 1/2014 Yamaguchi .......... G01R 31/024 307/9.1
2015/0167560 A1* 6/2015 Wu ....................... F02D 41/221 701/102

FOREIGN PATENT DOCUMENTS

JP 2014-17974 A 1/2014

* cited by examiner

Primary Examiner — Melissa Koval
Assistant Examiner — Trung Nguyen
(74) Attorney, Agent, or Firm — Westerman, Hattori, Daniels & Adrian, LLP

(57) ABSTRACT

A ground fault detecting device includes a signal generating unit that generates a signal for ground fault detection, a signal supply unit that supplies the signal for ground fault detection to an object of ground fault detection a signal processing unit that executes signal processing of a detection-target signal including at least the signal for ground fault detection obtained from the object of ground fault detection a signal separating unit that extracts the signal for ground fault detection from an output signal of the signal processing unit, and a ground fault detecting unit that detects occurrence of a ground fault in the object of ground fault detection based on the signal for ground fault detection output from the signal separating unit. The signal supply unit and the signal separating unit are configured by passive elements. The signal generating unit and the signal processing unit are configured as active circuits.

2 Claims, 2 Drawing Sheets

GROUND FAULT DETECTING DEVICE

CROSS REFERENCE TO RELATED APPLICATION

The present application claims priority under 35 U.S.C. § 119 to Japanese Patent Application No. 2016-028086 filed in the Japan Patent Office on Feb. 17, 2016, the entire content of which is hereby incorporated by reference.

TECHNICAL FIELD

The present invention relates to a ground fault detecting device.

BACKGROUND OF THE INVENTION

Japanese patent laid-open publication No. 2014-17974 ("JP '974") discloses a ground fault detecting device that can simultaneously carry out ground fault detection for a non-grounded circuit and detection of the supply voltage of the non-grounded circuit and can detect a ground fault irrespective of the ground fault potential based on a circuit configuration that allows achievement of size reduction. This ground fault detecting device includes a ground fault detecting unit and a supply voltage detecting unit. The ground fault detecting unit detects a ground fault of a non-grounded circuit based on a ground fault detection signal of a ground fault signal detecting circuit when a signal for detection is superimposed on a positive-side output unit and a negative-side output unit by an inverting amplifier connected to the positive-side output, unit via a first relay circuit and an inverting amplifier connected to the negative-side output unit via a second relay circuit. The supply voltage detecting unit detects the output voltage of a lithium ion battery based on a first supply voltage detection signal of a first supply voltage detecting circuit.

SUMMARY OF THE INVENTION

In JP '974, a power supply for a detection signal oscillator that generates the signal for detection is different from a power supply for the inverting amplifier and the ground fault signal detecting circuit that process the ground fault detection signal. Thus, an error is possibly included in the ground fault detection signal. Therefore, there is a possibility that the accuracy of ground fault detection decreases attributed to this error.

The present invention intends to improve the accuracy of ground fault detection.

To achieve the above-described object, a ground fault detecting device according to an embodiment of the present invention has the following configuration as a first configuration. Specifically, the ground fault detecting device includes a signal generating unit, a signal supply unit, a signal processing unit, a signal separating unit, and a ground fault detecting unit. The signal generating unit generates a signal for ground fault detection. The signal supply unit supplies the signal for ground fault detection to an object of ground fault detection. The signal processing unit executes signal processing of a detection-target signal including at least the signal for ground fault detection obtained from the object of ground fault detection. The signal separating unit extracts the signal for ground fault detection from an output signal of the signal processing unit. The ground fault detecting unit detects occurrence of a ground fault in the object of ground fault detection based on the signal for ground fault detection output from the signal separating unit. The signal supply unit and the signal separating unit are configured by passive elements, and the signal generating unit and the signal processing unit are configured as active circuits that operate by a single power supply.

In the first configuration, the following configuration may be employed as a second configuration. Specifically, the object of ground fault detection is a pair of lines and the signal processing unit is provided for each of the pair of lines. Furthermore, the signal supply unit supplies the signal for ground fault detection to one or both of the pair of lines.

In the second configuration, the following configuration may be employed as a third configuration. Specifically, the signal separating unit adds respective output signals of a pair of the signal processing units to generate an addition signal, and extracts the signal for ground fault detection from the addition signal.

In the second configuration, the following configuration may be employed as a fourth configuration. Specifically, the pair of lines are a pair of transmission lines connected to respective terminals of a vehicle battery, and the pair of the signal processing units are amplification circuits that divide respective terminal voltages of the vehicle battery input from the pair of transmission lines and carry out buffering.

In the fourth configuration, the following configuration may be employed as a fifth configuration. Specifically, the ground fault detecting device further includes a second signal processing unit and a voltage detecting unit. The second signal processing unit removes the signal for ground fault detection from output signals of the pair of the signal processing units and carries out addition. The voltage detecting unit detects a voltage across terminals of the vehicle battery based on an output of the second signal processing unit.

According to the embodiment of the present invention, the signal supply unit and the signal separating unit are configured by passive elements, and the signal generating unit and the signal processing unit are configured as active circuits that operate by a single power supply. Thus, the signal supply unit, the signal separating unit, the signal generating unit, and the signal processing unit all operate by the single power supply. Therefore, according to the embodiment of the present invention, the accuracy of ground fault detection can be improved compared with the related art because different power supplies are not used.

BRIEF DESCRIPTION OF THE DRAWINGS

The advantages of this invention will become apparent in the following description taken in conjunction with the drawings, wherein.

DETAILED DESCRIPTION OF THE INVENTION

One embodiment of the present invention will be described below with reference to the drawings.

Figure 1:
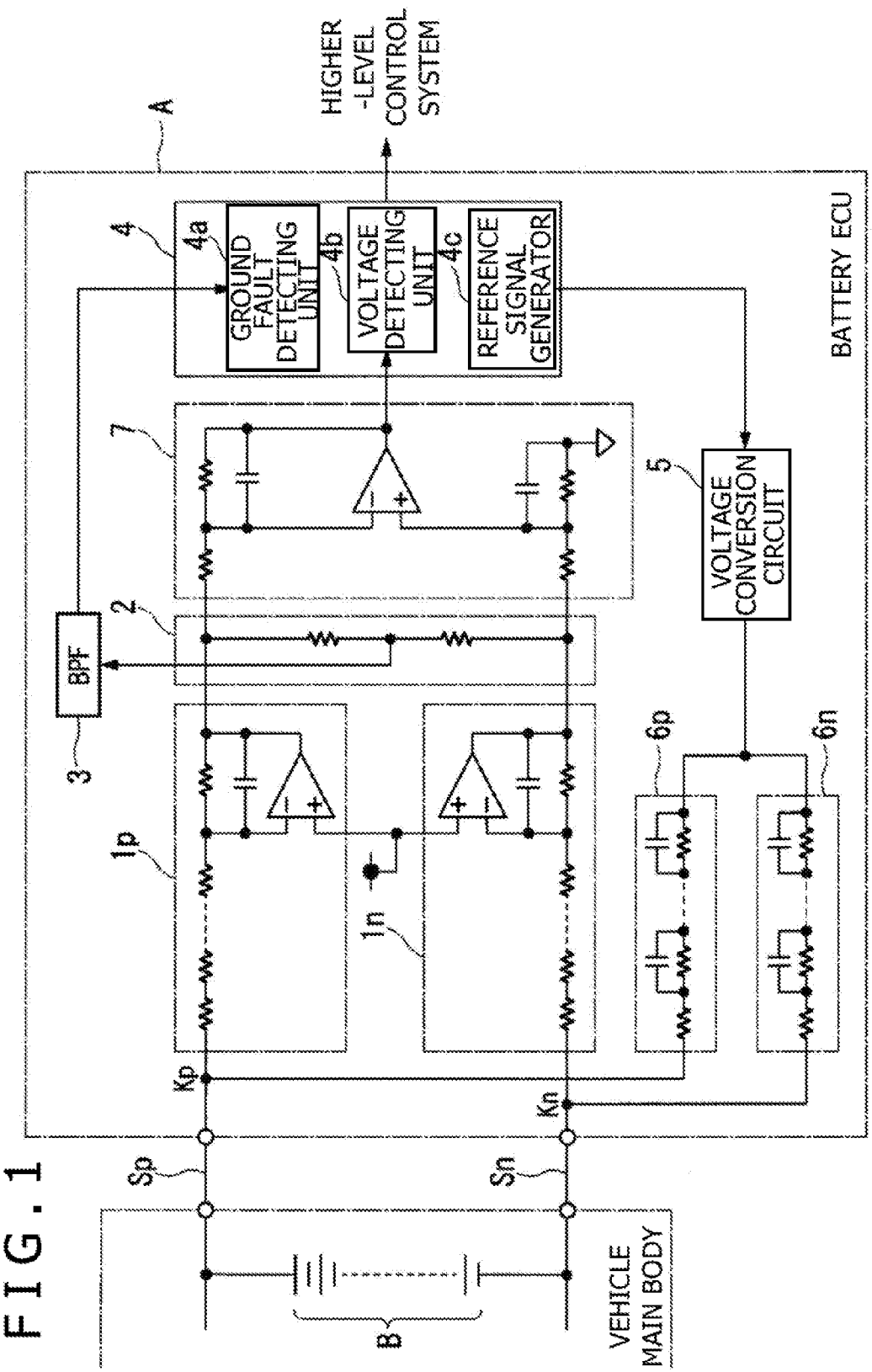
FIG. 1 is a circuit diagram showing the overall configuration of a ground fault detecting device A according to one embodiment of the present invention.

As shown in FIG. 1, a ground fault detecting device A according to the present embodiment is provided in a battery electronic control unit (ECU) that monitors the state of a battery B (vehicle battery) with which a vehicle main body is equipped, and deems a pair of high-voltage transmission lines that connect the battery B and the battery ECU as the object of ground fault detection. The pair of high-voltage transmission lines are a first transmission line Sp that connects the positive terminal of the battery B and the battery ECU and a second transmission line Sn that connects the negative terminal of the battery B and the battery ECU as shown in the diagram.

The ground fault detecting device A includes a pair of voltage dividing circuits 1p and 1n, an addition circuit 2, a band-pass filter (BPF) 3, a microprocessor unit (MPU) 4, a voltage conversion circuit 5, a pair of coupling circuits 6p and 6n, and a differential amplifier 7 as shown in the diagram. Furthermore, the ground fault detecting device A operates by a single power supply E whose supply voltage is at a predetermined positive potential (+Vcc).

The pair of voltage dividing circuits 1p and 1n are inverting amplifiers each using an operational amplifier (active element) as shown in the diagram, and are each composed of plural resistors, the operational amplifier, and a capacitor. The pair of voltage dividing circuits 1p and 1n have exactly the same circuit configuration. Furthermore, the first transmission line Sp is connected as an input to one voltage dividing circuit 1p of the pair of voltage dividing circuits 1p and 1n, and the second transmission line Sn is connected as an input to the other voltage dividing circuit 1n.

Furthermore, in the one voltage dividing circuit 1p, the input resistor of the operational amplifier is a series connected circuit of plural resistors as shown in the diagram. The one voltage dividing circuit 1p divides a first input signal V1 input from the first transmission line Sp and carries out buffering to output the resulting voltage. In the other voltage dividing circuit 1n, the input resistor of the operational amplifier is a series connected circuit of plural resistors similarly to the above-described one voltage dividing circuit 1p. The other voltage dividing circuit 1n divides a second input signal V2 input from the second transmission line Sn and carries out buffering to output the resulting voltage.

In addition, the pair of voltage dividing circuits 1p and 1n each function also as a low-pass filter because the capacitor is inserted in parallel to a feedback resistor of the operational amplifier. That is, the pair of voltage dividing circuits 1p and 1n also have a filter function of removing disturbance noise mixed in the first input signal V1 and the second input signal V2. Moreover, in such a pair of voltage dividing circuits 1p and 1n, the operational amplifier, which is an active element, operates by the power supply E. Such a pair of voltage dividing circuits 1p and 1n are each provided for a respective one of the pair of high-voltage transmission lines (first transmission line Sp and second transmission line Sn) corresponding to the positive terminal and the negative terminal of the battery B, and are a signal processing unit in the present embodiment.

The addition circuit 2 is a resistor adder that adds the output of the one voltage dividing circuit 1p and the output of the other voltage dividing circuit 1n by using resistors, which are passive elements. The addition circuit 2 generates an addition signal obtained by adding the output signal of the one voltage dividing circuit 1p and the output signal of the other voltage dividing circuit 1n, and outputs this addition signal to the BPF 3.

The BPF 3 is an LCR filter that allows the passing of only a signal in a predetermined frequency band and shows a band-pass characteristic based on a combination of a coil (L), a capacitor (C), and a resistor (R), which are passive elements. The BPF 3 extracts a signal for ground fault detection from the addition signal input from the addition circuit 2, i.e. the output signals of the pair of voltage dividing circuits 1p and 1n, and outputs the signal for ground fault detection to the MPU 4. The BPF 3 and the addition circuit 2 are a signal separating unit in the present embodiment and have an impedance $Z_{BPF}$. Details of the above-described signal for ground fault detection will be described later.

The MPU 4 is an integrated circuit obtained by integrating various kinds of interface circuits, memory circuits, arithmetic circuits, and so forth, and exerts various kinds of functions by executing a monitoring program stored inside in advance. The MPU 4 includes a ground fault detecting unit 4a, a voltage detecting unit 4b, and a reference signal generator 4c as shown in the diagram as functional configuration elements implemented in terms of software and in terms of hardware based on the above-described monitoring program. Furthermore, the MPU 4 operates by the above-described power supply E.

Although details will be described later, the ground fault detecting unit 4a is a functional configuration element that detects whether or not a ground fault has occurred in the first transmission line Sp and the second transmission line Sn, which are the object of ground fault detection, based on the amplitude (level) of the signal for ground fault detection input to the MPU 4 via the pair of voltage dividing circuits 1p and 1n, the addition circuit 2, and the BPF 3. The voltage detecting unit 4b is a functional configuration element that detects the charge state of the battery B and the occurrence of an abnormality based on a monitor signal input from the differential amplifier 7.

The reference signal generator 4c is a signal generating unit in the present embodiment and is a square wave generator that generates a reference signal serving as the basis of the above-described signal for ground fault detection. This reference signal is a digital signal that has a voltage lower than the supply voltage of the power supply E as the amplitude and in which the duty ratio is set to 50% and the repetition frequency is set to a predetermined frequency. The reference signal generator 4c outputs such a reference signal (digital signal) to the voltage conversion circuit 5. The voltage conversion circuit 5 is an active circuit that operates by the above-described power supply E and carries out voltage conversion of the above-described reference signal to a reference signal (digital signal) that has the supply voltage of the power supply E as the amplitude. The voltage conversion circuit 5 outputs the reference signal (digital signal) resulting from the voltage conversion to the pair of coupling circuits 6p and 6n.

The pair of coupling circuits 6p and 6n are each a series-parallel circuit composed of resistors and capacitors, which are passive elements, as shown in the diagram. The pair of coupling circuits 6p and 6n have exactly the same circuit configuration. Specifically, the pair of coupling circuits 6p and 6n are each a passive circuit composed of plural resistors connected in series to each other and plural capacitors connected in parallel to these resistors, and one end of each of the coupling circuits 6p and 6n is connected to the output of the voltage conversion circuit 5 in common. Such a pair of coupling circuits 6p and 6n and the voltage conversion circuit 5 are a signal supply unit in the present embodiment.

The other end of one coupling circuit 6p of such a pair of coupling circuits 6p and 6n is connected to an input terminal Kp of the one voltage dividing circuit 1p, i.e. the connecting node of the first transmission line Sp in the battery ECU. Furthermore, the other end of the other coupling circuit 6n is connected to an input terminal Kn of the other voltage dividing circuit 1n, i.e. the connecting node of the second transmission line Sn in the battery ECU.

The reference signal (digital signal) input from the voltage conversion circuit 5 to the one coupling circuit 6p is subjected to voltage dividing by the impedance of the one coupling circuit 6p and the impedance of the other circuit connected to the connecting node of the first transmission line Sp, and is supplied to the input terminal of the one voltage dividing circuit 1p as the above-described signal for ground fault detection. Furthermore, the reference signal (digital signal) input from the voltage conversion circuit 5 to the other coupling circuit 6n is subjected to voltage dividing by the impedance of the other coupling circuit 6n and the impedance of the other circuit connected to the connecting node of the second transmission line Sn, and is supplied to the input terminal of the other voltage dividing circuit 1n as the above-described signal for ground fault detection.

Impedance $Z_{6p}$ of the above-described other circuit relating to the one coupling circuit 6p is a combined impedance of impedances on the vehicle main body side, such as impedance $Z_{1p}$ of the one voltage dividing circuit 1p, impedance $Z_{Sp}$ of the first transmission line Sp, and the internal impedance of the battery B. Furthermore, impedance $Z_{6a}$ of the above-described other circuit relating to the other coupling circuit 6n is a combined impedance of impedances on the vehicle main body side, such as impedance $Z_{1n}$ of the other voltage dividing circuit 1n, impedance $Z_{Sn}$ of the second transmission line Sn, and the internal impedance of the battery B. Assuming that the internal impedance of the battery B is sufficiently low, the impedances on the vehicle main body side can be considered as substantially zero.

That is, to the input terminal Kp of the one voltage dividing circuit 1p, a signal resulting from superposition of the signal for ground fault detection with predetermined amplitude determined by the impedance $Z_{6p}$ of the one coupling circuit 6p and the impedance of the above-described other circuit on a terminal voltage Vp of the positive terminal of the battery B is input as the first input signal V1. Furthermore, to the input terminal Kn of the other voltage dividing circuit 1n, a signal resulting from superposition of the signal for ground fault detection with predetermined amplitude determined by the impedance $Z_{6n}$ of the other coupling circuit 6n and the impedance of the above-described other circuit on a terminal voltage Vn of the negative terminal of the battery B is input as the second input signal V2.

The signal for ground fault detection input to the one voltage dividing circuit 1p is a superimposed signal for detecting a ground fault of the first transmission line Sp that transmits the terminal voltage Vp of the positive terminal of the battery B. Furthermore, the signal for ground fault detection input to the other voltage dividing circuit 1n is a superimposed signal for detecting a ground fault of the second transmission line Sn that transmits the terminal voltage Vn of the negative terminal of the battery B. In addition, the above-described pair of voltage dividing circuits 1p and 1n are the signal processing unit that executes signal processing of the first and second input signals V1 and V2 (detection-target signals) in which at least the signals for ground fault detection obtained from the first and second transmission lines Sp and Sn are included.

The differential amplifier 7 is an amplification circuit that removes the signals for ground fault detection from the output signals of the above-described pair of voltage dividing circuits 1p and 1n and amplifies the difference (difference voltage). That is, the output of the differential amplifier 7 is a voltage signal obtained by dividing the voltage across the terminals of the battery B and is an output with which the charge state of the battery B and an abnormality can be evaluated. The differential amplifier 7 outputs such a voltage signal to the MPU 4 as the monitor signal of the battery B. The differential amplifier 7 is a second signal processing unit in the present embodiment.

Next, the operation of the ground fault detecting device A configured in this manner will be described in detail below with reference also to FIG. 2.

Figure 2:
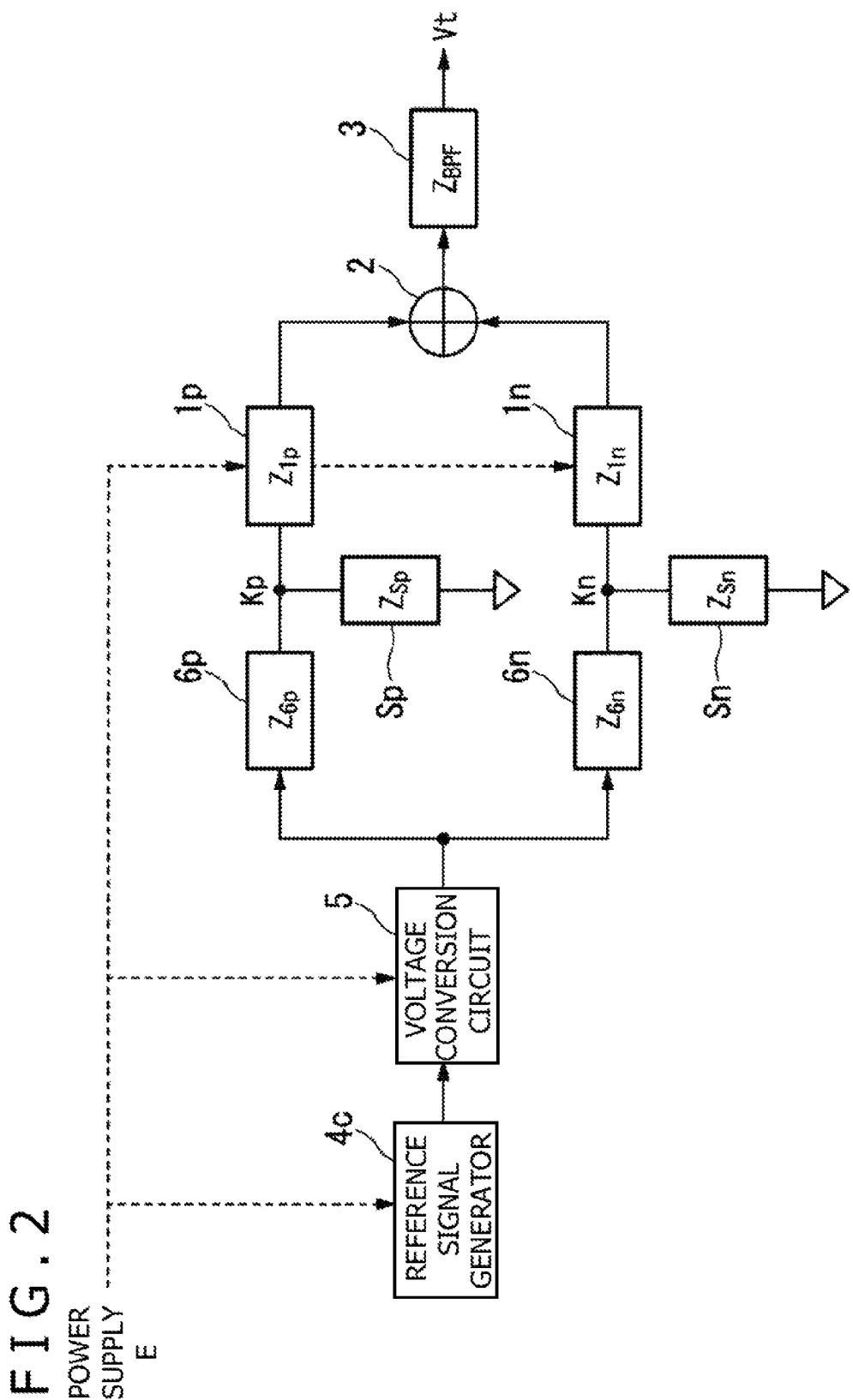
FIG. 2 is an impedance equivalent circuit of a signal for ground fault detection in the one embodiment of the present invention.

FIG. 2 is an impedance equivalent circuit of the signal for ground fault detection in the ground fault detecting device A. Specifically, in the ground fault detecting device A, a reference signal generated in the reference signal generator 4c is subjected to amplitude conversion by the voltage conversion circuit 5. Then, the resulting signal is supplied to the input terminal Kp of the one voltage dividing circuit 1p via the one coupling circuit 6p and is supplied to the input terminal Kn of the other voltage dividing circuit 1n via the other coupling circuit 6n.

The impedance $Z_{6p}$ of the one coupling circuit 6p is substantially equal to the impedance $Z_{6n}$ of the other coupling circuit 6n. The impedance $Z_{Sp}$ of the first transmission line Sp is substantially equal to the impedance $Z_{Sn}$ of the second transmission line Sn. The impedance $Z_{1p}$ of the one voltage dividing circuit 1p is substantially equal to the impedance $Z_{1n}$ of the other voltage dividing circuit 1n. Thus, the amplitude Vp of the signal for ground fault detection supplied to the one input terminal Kp is substantially equal to the amplitude Vn of the signal for ground fault detection supplied to the other input terminal Kn.

If a ground fault occurs in the first transmission line Sp, the impedance $Z_{Sp}$ of the first transmission line Sp changes from the impedance when the first transmission line Sp is normal and becomes substantially zero. Also regarding the impedance $Z_{Sn}$ of the second transmission line Sn, the impedance $Z_{Sn}$ changes from the impedance when the second transmission line Sn is normal and becomes substantially zero. Specifically, the amplitude Vp of the signal for ground fault detection supplied to the one input terminal Kp or/and the amplitude Vn of the signal for ground fault detection supplied to the other input terminal Kn change depending on whether or not a ground fault of the first transmission line Sp or/and the second transmission line Sn occurs. Furthermore, this change similarly varies amplitude Vt of the signal for ground fault detection input from the BPF 3 to the MPU 4.

The ground fault detecting unit 4a of the MPU 4 determines whether or not a ground fault of the first transmission line Sp or/and the second transmission line Sn has occurred based on the change in the amplitude Vt of the signal for ground fault detection input from the BPF 3. As above, in the ground fault detecting device A according to the present embodiment, whether or not a ground fault of the first transmission line Sp or/and the second transmission line Sn has occurred is determined based on the amplitude of the signal for ground fault detection. Thus, in the transmission path of the signal for ground fault detection, factors (error factors) that give an error (disturbance) to the amplitude of the signal for ground fault detection need to be removed as much as possible.

Furthermore, in the ground fault detecting device A according to the present embodiment, in order to remove the above-described error factors, the active circuits in the transmission path of the signal for ground fault detection, i.e. the reference signal generator 4c, the voltage conversion circuit 5, and the pair of voltage dividing circuits 1p and 1n, are driven by the single power supply E also as shown in FIG. 2.

Specifically, in the related art, because the MPU is driven by a different power supply, that the power supply for the reference signal generator is different from the power supply for the voltage conversion circuit 5 and the pair of voltage dividing circuits 1p and 1n and variation in the supply voltage is different between both power supplies for example possibly becomes an error factor. However, according to the ground fault detecting device A in accordance with the present embodiment, the single power supply E is used and therefore the error factor attributed to the difference in the power supply can be completely avoided. Thus, the accuracy of ground fault detection can be improved.

The present invention is not limited to the above-described embodiment and the following modification examples are conceivable for example.

(1) In the above-described embodiment, the occurrence of a ground fault of the first transmission line Sp and the second transmission line Sn is detected by supplying the signal for ground fault detection to both of the pair of input terminals Kp and Kn. However, the present invention is not limited thereto. For example, the occurrence of a ground fault of either one of the first transmission line Sp and the second transmission line Sn may be detected by supplying the signal for ground fault detection to either one of one input terminal Kp and the other input terminal Kn.

(2) In the above-described embodiment, the first transmission line Sp and the second transmission line Sn that transmit the terminal voltages of the battery B are deemed as the object of ground fault detection. However, the present invention is not limited thereto. The present invention can be applied to various objects of ground fault detection.

(3) In the above-described embodiment, the output of the one voltage dividing circuit 1p and the output of the other voltage dividing circuit 1n are added by the addition circuit 2 and thereafter the signal for ground fault detection is separated by the BPF 3. However, the present invention is not limited thereto. For example, the occurrence of a ground fault of the first transmission line Sp and the occurrence of a ground fault of the second transmission line Sn may be individually detected by removing the addition circuit 2 and providing a pair of BPFs and a pair of ground fault detecting units corresponding to the pair of voltage dividing circuits 1p and 1n.

It should be understood by those skilled in the art that various modifications, combinations, sub-combinations and alterations may occur depending on design requirements and other factors insofar as they are within the scope of the appended claims or the equivalents thereof.

We claim:

1. A ground fault detecting device comprising:
   a signal generating unit that generates a signal for ground fault detection;
   a signal supply unit that supplies the signal for ground fault detection to an object of ground fault detection;
   a signal processing unit that executes signal processing of a detection-target signal including at least the signal for ground fault detection obtained from the object of ground fault detection;
   a signal separating unit that extracts the signal for ground fault detection from an output signal of the signal processing unit; and
   a ground fault detecting unit that detects occurrence of a ground fault in the object of ground fault detection based on the signal for ground fault detection output from the signal separating unit, wherein
   the signal supply unit and the signal separating unit are configured by passive elements,
   the signal generating unit and the signal processing unit are configured as active circuits that operate by a single power supply,
   the object of ground fault detection is a pair of lines,
   the signal processing unit is provided for each of the pair of lines,
   the signal supply unit supplies the signal for ground fault detection to one or both of the pair of lines, and
   the pair of lines are a pair of transmission lines connected to respective terminals of a vehicle battery, and the pair of the signal processing units are amplification circuits that divide respective terminal voltages of the vehicle battery input from the pair of transmission lines and carry out buffering.

2. The ground fault detecting device according to claim 1, further comprising:
   a second signal processing unit that removes the signal for ground fault detection from output signals of the pair of the signal processing units and carries out addition; and
   a voltage detecting unit that detects a voltage across terminals of the vehicle battery based on an output of the second signal processing unit.

\* \* \* \* \*